United States Patent
Uo et al.

(10) Patent No.: US 7,635,837 B2
(45) Date of Patent: Dec. 22, 2009

(54) OPTICAL RECEIVING CIRCUIT

(75) Inventors: Toyoaki Uo, Kanagawa-ken (JP); Shigeyuki Sakura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/047,718

(22) Filed: Mar. 13, 2008

(65) Prior Publication Data

US 2008/0230683 A1    Sep. 25, 2008

(30) Foreign Application Priority Data

Mar. 20, 2007   (JP)   ............................ 2007-073374

(51) Int. Cl.
    H01J 40/14    (2006.01)
    H03F 3/08     (2006.01)
(52) U.S. Cl. .............................. 250/214 A; 250/214 R; 330/308; 398/202
(58) Field of Classification Search ............. 250/214 R, 250/214 A, 214 LA, 214 AG, 214 DC; 330/308, 330/254, 59, 110; 398/202, 208, 209
See application file for complete search history.

(56) References Cited

U.S. PATENT DOCUMENTS

| | | | |
|---|---|---|---|
| 5,247,211 A | | 9/1993 | Sakura |
| 6,038,049 A | * | 3/2000 | Shimizu et al. ............. 398/210 |
| 6,885,249 B2 | | 4/2005 | Suzunaga |
| 7,449,669 B2 | * | 11/2008 | Sakura ................... 250/214 A |
| 2007/0075886 A1 | | 4/2007 | Sakura et al. |
| 2007/0126507 A1 | | 6/2007 | Sakura |

FOREIGN PATENT DOCUMENTS

| | | |
|---|---|---|
| JP | 06216854 | 8/1994 |
| JP | 09083315 | 3/1997 |

OTHER PUBLICATIONS

Japanese Office Action dated Jul. 14, 2009 corresponding to U.S. Appl. No. 12/047,718 filed on Mar. 13, 2008.

* cited by examiner

*Primary Examiner*—Kevin Pyo
(74) *Attorney, Agent, or Firm*—Turocy & Watson, LLP

(57) ABSTRACT

A light receiving circuit includes: a first transimpedance amplifier configured to convert an input signal to a voltage signal, the input signal being current-converted by a first photodiode; a second transimpedance amplifier connected to a light-shielded second photodiode, and being configured to output a reference voltage; a differential amplifier; a transconductance amplifier; a voltage source; and a conversion element. The differential amplifier has a first terminal and a second terminal, and amplifies a difference between the voltage signal inputted to the first terminal and a signal inputted to the second terminal. The transconductance amplifier receives as input a branch of the voltage signal and outputs a current signal to the second terminal. The voltage source superimposes an offset voltage on the output voltage of the second transimpedance amplifier. The conversion element is provided between the voltage source and the second terminal, and voltage-converts the current signal.

19 Claims, 4 Drawing Sheets

DIFFERENTIAL AMPLIFIER
INPUT WAVEFORMS

DIFFERENTIAL AMPLIFIER
OUTPUT WAVEFORMS

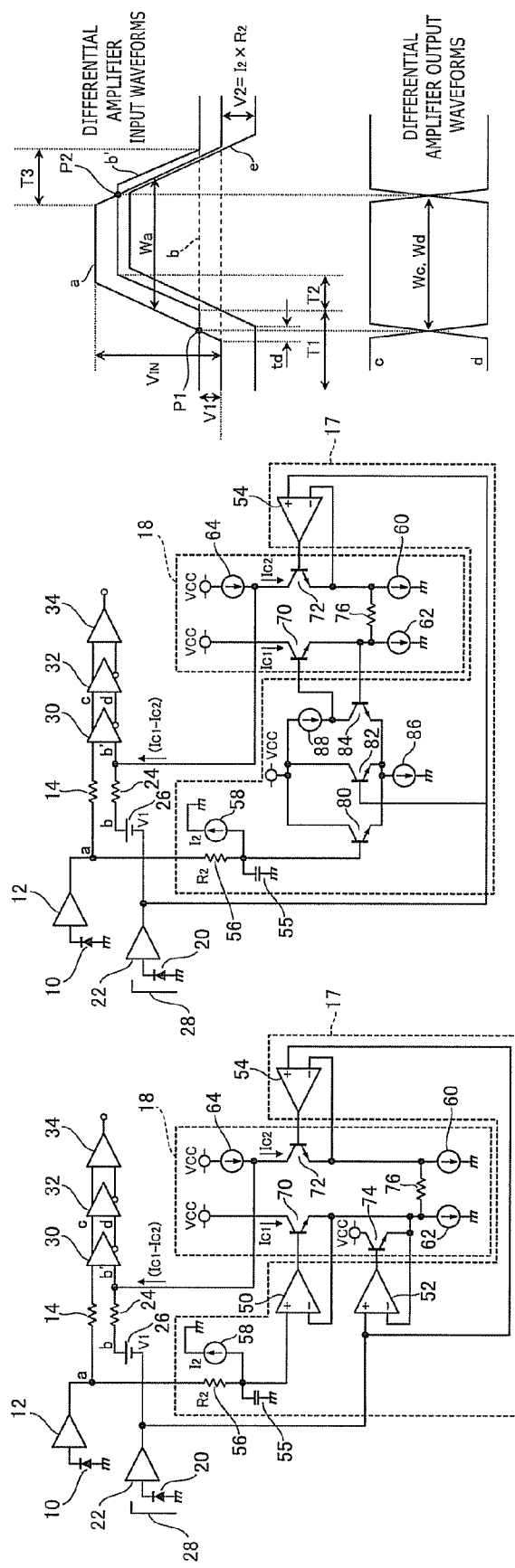

OPTICAL RECEIVING CIRCUIT

CROSS-REFERENCE TO RELATED APPLICATIONS

This application is based upon and claims the benefit of priority from the prior Japanese Patent Application No. 2007-073374, filed on Mar. 20, 2007; the entire contents of which are incorporated herein by reference.

BACKGROUND OF THE INVENTION

1. Field of the Invention

This invention relates to a light receiving circuit.

2. Background Art

In an optical coupler or an optical data link for transmitting digital signals, an optical digital signal is converted to an electrical digital signal by an optical receiving circuit. The optical receiving circuit includes photodiodes, transimpedance amplifiers, a differential amplifier, and a comparator. The output current of a photodiode that receives as input an optical signal is inputted to a transimpedance amplifier. The output current of a light-shielded dummy photodiode is inputted to a dummy transimpedance amplifier.

The output voltages of the two transimpedance amplifiers are inputted to the differential amplifier, which amplifies the difference of the output voltages and outputs a balanced signal and an inverted balanced signal. Furthermore, the comparator shapes the waveform. To enhance the signal transmission quality, it is necessary to reduce the pulse width distortion of the digital signal.

U.S. Pat. No. 6,885,249 discloses a technique concerning an optical signal receiving circuit that reduces pulse width distortion. In this technique, a level shift circuit is used to shift the voltage signal, thereby reducing pulse width distortion.

SUMMARY OF THE INVENTION

According to an aspect of the invention, there is provided an optical receiving circuit including: a first transimpedance amplifier configured to convert an input signal to a voltage signal, the input signal being current-converted by a first photodiode; a second transimpedance amplifier connected to a light-shielded second photodiode, and being configured to output a reference voltage; a differential amplifier having a first terminal and a second terminal, and being configured to amplify a difference between the voltage signal inputted to the first terminal and a signal inputted to the second terminal; a transconductance amplifier configured to receive as input a branch of the voltage signal and output a current signal to the second terminal; a voltage source configured to superimpose an offset voltage on the output voltage of the second transimpedance amplifier; and a conversion element provided between the voltage source and the second terminal, and being configured to voltage-convert the current signal.

According to another aspect of the invention, there is provided an optical receiving circuit including: a first transimpedance amplifier configured to convert an input signal to a voltage signal, the input signal being current-converted by a first photodiode; a second transimpedance amplifier connected to a light-shielded second photodiode, and being configured to output a reference voltage; a differential amplifier having a first terminal and a second terminal, and being configured to amplify a difference between the voltage signal inputted to the first terminal and a signal inputted to the second terminal; a voltage source configured to superimpose an offset voltage on the output voltage of the second transimpedance amplifier; a comparison circuit having a first terminal receiving as input a branch of the voltage signal and a second terminal receiving as input a branch of the reference voltage; a transconductance amplifier receiving as input an output signal of the comparison circuit and having an output terminal connected to the second terminal of the differential amplifier; and a conversion element provided between the voltage source and the second terminal of the differential amplifier, and being configured to voltage-convert a current signal.

According to another aspect of the invention, there is provided an optical receiving circuit including: a first transimpedance amplifier configured to convert an input signal to a voltage signal, the input signal being current-converted by a first photodiode; a second transimpedance amplifier connected to a light-shielded second photodiode, and being configured to output a reference voltage; a differential amplifier having a first terminal and a second terminal for amplifying a difference between the voltage signal inputted to the first terminal and a signal inputted to the second terminal; a voltage source configured to superimpose an offset voltage on the output voltage of the second transimpedance amplifier; a comparison circuit having a first terminal receiving as input a branch of the voltage signal through a delay circuit and a second terminal receiving as input a branch of the reference voltage; a transconductance amplifier receiving as input an output signal of the comparison circuit and having an output terminal connected to the second terminal of the differential amplifier; and a conversion element provided between the voltage source and the second terminal of the differential amplifier, and being configured to voltage-convert a current signal.

BRIEF DESCRIPTION OF THE DRAWINGS

FIG. 4A is a first circuit diagram showing a comparison circuit and a transconductance amplifier, FIG. 4B is a second circuit diagram thereof, and FIG. 4C shows operation waveforms.

DETAILED DESCRIPTION OF THE INVENTION

Figure 1A:
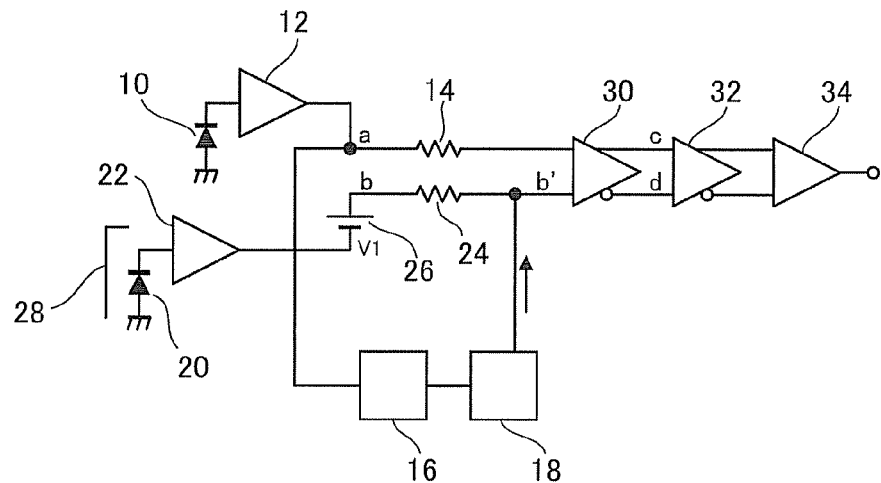
FIG. 1A is a block diagram of an optical receiving circuit according to a first embodiment of the invention.
Figure 1B:
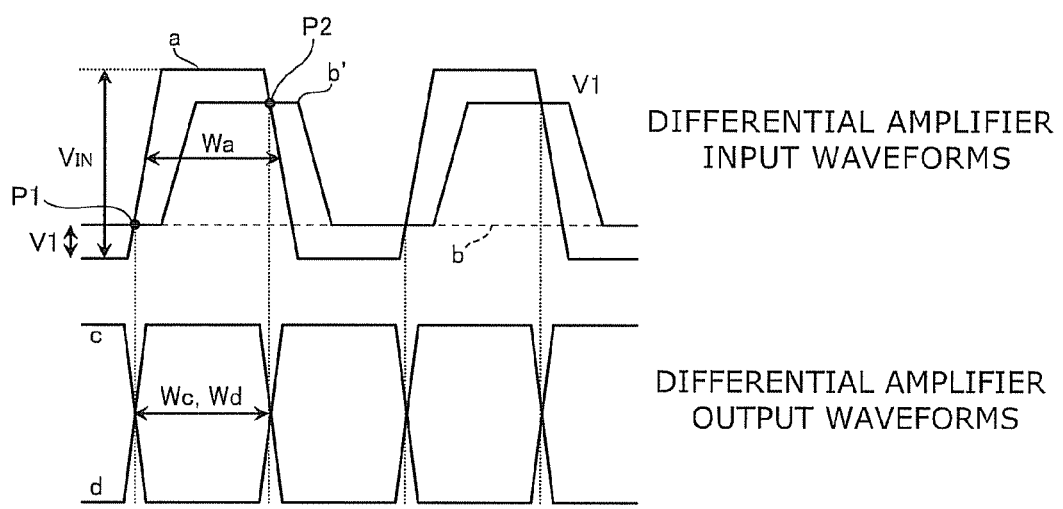
FIG. 1B shows its operation waveforms.

FIG. 1 illustrates an optical receiving circuit according to a first embodiment of the invention, where FIG. 1A is its block diagram, and FIG. 1B shows its operation waveforms. This embodiment has a receiver, which includes a photodiode 10 for converting an optical signal to a current and a transimpedance amplifier 12 for converting the output current of the photodiode 10 to a voltage. This embodiment also has a dummy receiver, which includes a photodiode 20, a transimpedance amplifier 22, and an optical shield 28, where the photodiode 20 and the transimpedance amplifier 22 have characteristics generally equivalent to those of the photodiode 10 and the transimpedance amplifier 12. Preferably, the photodiode 10 and the photodiode 20 have an identical structure and are formed by an identical process.

The voltage signals from the receiver and the dummy receiver are inputted to a differential amplifier 30, which amplifies the difference of the output voltages and outputs a balanced signal and an inverted balanced signal. Furthermore, a comparator 32 shapes the waveform, which is inputted to an output circuit 34.

If the output of the transimpedance amplifier 12 during a no-signal period generally coincides with the output level of the transimpedance amplifier 22 of the dummy receiver, the differential amplifier 30 becomes unstable. Hence an offset voltage V1 is added to the output of the dummy receiver.

The output voltage signal of the transimpedance amplifier 12 of the receiver is superimposed on the output from the dummy receiver through a delay circuit 16 and a transconductance amplifier 18. A resistor 24 is interposed between a voltage source 26, which superimposes the offset voltage V1 on the output voltage of the dummy receiver, and the input terminal of the differential amplifier 30. The resistor 24 converts the current output of the transconductance amplifier 18 to a voltage. That is, the resistor 24 acts as a conversion element for converting the current output of the transconductance amplifier 18 to a voltage.

A resistor 14 is provided between the transimpedance amplifier 12 and the differential amplifier 30. However, the resistor 14 is intended for matching the resistance on the input side of the differential amplifier 30 with that on the resistor 24 side, and may be omitted.

Next, the operation of the optical receiving circuit is described with reference to FIG. 1B. The voltage signal a of the transimpedance amplifier 12 is applied to the resistor 24 and the input terminal on the dummy receiver side of the differential amplifier 30 through the delay circuit 16 and the transconductance amplifier 18. Hence the offset voltage V1 is superimposed on the reference voltage to result in a voltage b, on which the voltage converted by the resistor 24 is further superimposed to result in a threshold b'.

When the voltage signal a is higher than the threshold b', the balanced signal d of the differential amplifier 30 rises, and the inverted balanced signal c falls. When the voltage signal a begins to fall and goes below the threshold b', the balanced signal c begins to rise, and the inverted balanced signal d begins to fall.

When the voltage signal a begins to rise, the current of the transconductance amplifier 18 flows into the resistor 24, and the threshold b' follows the voltage signal a. Here, the pulse width distortion is reduced by appropriately selecting the transconductance, the resistance, and the offset voltage V1 so that the voltage signal a definitely crosses the threshold b' at points P1 and P2. The pulse width is defined as the time period from the time when the amplitude of the voltage signal a rises to 50% of the maximum amplitude until the time when it falls to 50% of the maximum amplitude.

Furthermore, if the product of the transconductance of the transconductance amplifier 18 and the resistance of the resistor 24 is set to $1-2 \times V1/V_{IN}$, the pulse width Wa can be matched more exactly with Wc and Wd as shown in FIG. 1B. Here, V1 denotes the offset voltage, and $V_{IN}$ denotes the amplitude of the voltage signal a. That is, the transconductance, the resistance, and the offset voltage V1 are appropriately selected so that the voltage signal a crosses the threshold b'.

The delay circuit 16 may be omitted. However, the delay circuit 16 allows the rapidly rising voltage signal a and threshold b' to cross each other more definitely and facilitates adjustment and waveform shaping.

Figure 2A:
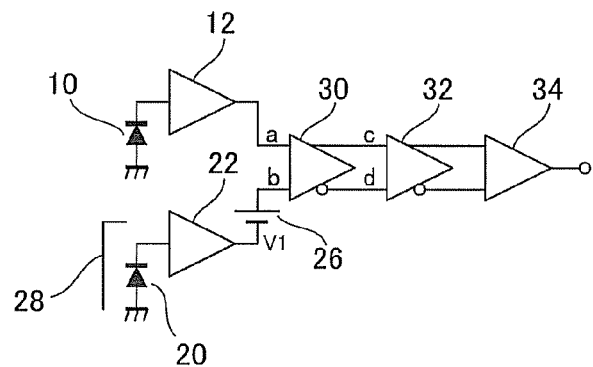
FIG. 2A is as block diagram of an optical receiving circuit according to a comparative example.
Figure 2B:
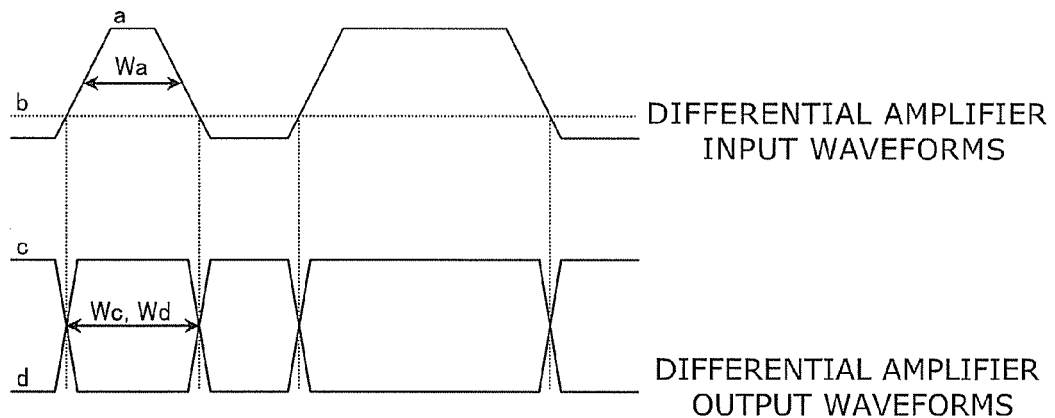
FIG. 2B shows its operation waveforms.

FIG. 2 shows an optical receiving circuit according to a comparative example, where FIG. 2A is its block diagram, and FIG. 2B shows its operation waveforms. In this comparative example, the output of the dummy receiver is shifted by an offset voltage V1 and inputted to a differential amplifier 30. The threshold b' is often set to less than half the amplitude of the voltage signal a. Hence the pulse widths Wc and Wd of the balanced signals are larger than the pulse width Wa, causing pulse width distortion.

Also known is a configuration in which a level shift circuit for varying threshold b' in response to the amplitude of the voltage signal a is used to reduce pulse width distortion. However, during the time period until the operation of a detection circuit constituting the level shift circuit is stabilized, the pulse widths Wc and Wd of the balanced signals also vary. Hence it is difficult to reduce pulse width distortion when the data pattern varies diversely.

In contrast, in the first embodiment, the offset voltage V1, the transconductance, and the resistance are appropriately selected to provide an optical receiving circuit capable of reducing pulse width distortion in signal transmission and high-speed data transmission for diverse data patterns. This embodiment is particularly useful for high-speed signal transmission in an optical coupler for industrial equipment and an optical data link.

Figure 3A:
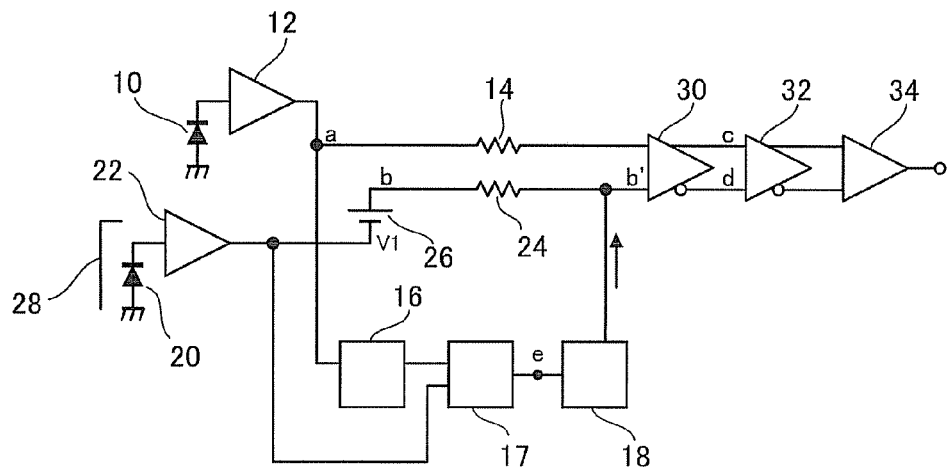
FIG. 3A is a block diagram of an optical receiving circuit according to a second embodiment of the invention.
Figure 3B:
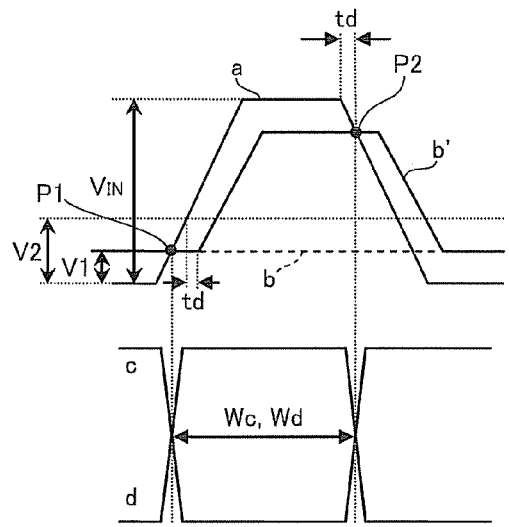
FIGS. 3B and 3C show operation waveforms.

FIG. 3A is a block diagram of an optical receiving circuit according to a second embodiment of the invention, and FIG. 3B shows its operation waveforms. This embodiment is different from the first embodiment in that a comparison circuit 17 is interposed between the transimpedance amplifier 12 and the transconductance amplifier 18. As explained in detail later, instead of providing the delay circuit 16 between the transimpedance amplifier 12 and the comparison circuit 17, the delay circuit 16 may be provided as a part of the comparison circuit 17.

In this embodiment, the outputs of the transimpedance amplifiers 12, 22 are each branched and inputted to the comparison circuit 17. Here, for example, when the output voltage signal a of the transimpedance amplifier 12 equals a prescribed value V2 or more, the output signal of the comparison circuit 17 triggers the transconductance amplifier 18 to output a current signal. This allows the threshold b' to begin to follow the voltage signal a, thereby accelerating the rise of the threshold b', and simultaneously allows the voltage signal a and the threshold b' to definitely cross each other. It is noted that a delay circuit may be disposed between the first transimpedance amplifier 12 and the transconductance amplifier 18.

In FIG. 3B, the voltage signal a is delayed by the delay circuit 16 for a delay time $t_d$ and inputted to the comparison circuit 17, which is operated when the input amplitude of the voltage signal a equals V2 or more. The output of the comparison circuit 17 serves as an input voltage signal e of the transconductance amplifier 18.

In the case where the threshold V2 of the comparison circuit 17 is set higher than V1, the threshold b' remains unchanged if the difference of the output voltages of the transimpedance amplifiers 12, 22 equals V2 or less. In other words, the comparison circuit 17 has a switching function of turning on the transconductance amplifier 18 when the voltage signal a equals V2 or more. The value V2 is set to twice V1, for example.

Figure 3C:
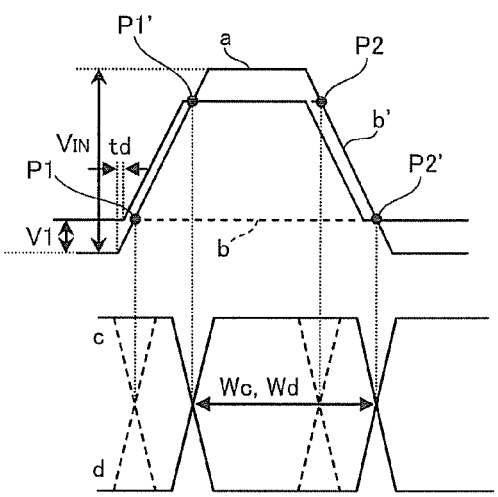

However, if V2 is not provided, the intersection of the voltage signal a and the threshold b' may be different from the point P1 in FIG. 3B. That is, if the rise time of the voltage signal a is sufficiently longer than the delay time $t_d$, the intersection P1 may change. For example, as shown in FIG. 3C, intersections P1', P2' of the voltage signal a and the threshold b', which begins to rise after the delay time $t_d$, are greatly shifted forward, and the crossing time of the balanced signals c, d depends on the rise time of the voltage signal a. In contrast, in this embodiment, even if the rise time is as long as several ten ms as compared with the delay time (for example, several ns), the time period until the voltage signal a equals V2 or more does not affect the threshold b'. This allows the voltage signal a and the threshold b' to definitely cross each other at points P1 and P2 and prevents the circuit operating state from depending on the rise time of the voltage signal a. Furthermore, for example, even in the case of direct-current or low-frequency voltage operation in the inspection process for inspecting optical characteristics such as coupling efficiency, the increase of the threshold b' due to positive feedback by the transconductance amplifier 18 can be prevented, allowing accurate inspection.

Here, the comparison circuit 17 and the transconductance amplifier 18 in the second embodiment are described in more detail. FIG. 4A is a first circuit diagram showing the comparison circuit 17 and the transconductance amplifier 18, and FIG. 4B is a second circuit diagram thereof. The transconductance amplifier 18 comprises transistors 70, 72, 74, a resistor 76, and current sources 60, 62, 64. The current values of the current sources 60, 62, 64 are set equal. The comparison circuit 17 comprises a resistor 56, a current source 58, and amplifiers 50, 52, 54. FIG. 4C shows operation waveforms.

First, in FIG. 4A, the branched voltage signal a is shifted to the low-potential side by $V2=R_2 \times I_2$ by the current source 58 (current $I_2$) and the resistor 56 (resistance $R_2$) and inputted to the plus terminal of the amplifier 50. On the other hand, the reference voltage, which is the output of the transimpedance amplifier 22, is inputted to the plus terminals of the amplifiers 52, 54. If the difference between the voltage signal a and the reference voltage is smaller than the product of the resistance of the resistor 56 and the current of the current source 58, $R_2 \times I_2$, then the output terminal of the amplifier 52 has a higher potential than the output terminal of the amplifier 50, turning on the transistor 74 and turning off the transistor 70. Because the amplifier 52 and the amplifier 54 have the same input, the currents $I_{C1}$ and $I_{C2}$ of the transistors 74, 72 are generally equal. Hence the output current of the transconductance amplifier 18 vanishes, and the threshold b' remains unchanged (time period T1).

Conversely, if the difference between the voltage signal a and the reference voltage is larger than the product of the resistance of the resistor 56 and the current of the current source 58, $R_2 \times I_2$, then the output terminal of the amplifier 50 has a higher potential than the output terminal of the amplifier 52, turning on the transistor 70 and turning off the transistor 74. Furthermore, the input potential of the amplifier 50 is higher than the input potential of the amplifier 54, and the current $I_{C1}$ of the transistor 70 is larger than the current $I_{C2}$ of the transistor 72. Because the current of the current source 64 is constant, the decrease of the current of the transistor 72 from the balanced state represents the output current ($I_{C1}$-$I_{C2}$) of the transconductance amplifier 18 and flows into the resistor 24, raising the threshold b' (time period T2). Even if the voltage signal a begins to fall, the transconductance amplifier input signal e and the threshold b' begin to fall late due to the delay of the comparison circuit 17 and the transconductance amplifier 18. If a delay circuit additionally exists, b' can be delayed more definitely. Hence the voltage signal a can be accurately distinguished from the threshold b' (time period T3).

FIG. 4B is a second circuit diagram showing the comparison circuit 17 and the transconductance amplifier 18. The transconductance amplifier 18 comprises transistors 70, 72, a resistor 76, and current sources 60, 62, 64. The current values of the current sources 60, 62, 64 are set equal. The comparison circuit 17 comprises a resistor 56, a current source 58, transistors 80, 82, 84, current sources 86, 88, and an amplifier 54.

First, the branched voltage signal a is shifted to the low-potential side by $V2=R_2 \times I_2$ by the current source 58 (current $I_2$) and the resistor 56 (resistance $R_2$) and inputted to the base of the transistor 80. On the other hand, the reference voltage, which is the output of the transimpedance amplifier 22, is inputted to the base of the transistor 82 and the plus terminal of the amplifier 54. If the difference between the voltage signal a and the reference voltage is smaller than the product of the resistance of the resistor 56 and the current of the current source 58, $R_2 \times I_2$, then the collector of the transistor 82 has a higher potential than the collector of the transistor 80, turning on the transistor 82 and turning off the transistor 80. Because the transistor 70 and the transistor 72 have the same input, the currents $I_{C1}$ and $I_{C2}$ are generally equal. Hence the output current of the transconductance amplifier 18 vanishes, and the threshold b' remains unchanged (time period T1).

Conversely, if the difference between the voltage signal a and the reference voltage is larger than the product of the resistance of the resistor 56 and the current of the current source 58, $R_2 \times I_2$, then the collector of the transistor 80 has a higher potential than the collector of the transistor 82, turning on the transistor 80 and turning off the transistor 82. Furthermore, the base potential of the transistor 70 is higher than the base potential of the transistor 72, and the current $I_{C1}$ of the transistor 70 is larger than the current $I_{C2}$ of the transistor 72. Because the current of the current source 64 is constant, the decrease of the current of the transistor 72 from the balanced state represents the output current ($I_{C1}$-$I_{C2}$) of the transconductance amplifier 18 and flows into the resistor 24, raising the threshold b' (time period T2). The circuits of FIGS. 4A and 4B can be used to realize the transconductance amplifier 18 and the comparison circuit 17 of the second embodiment.

Further, in the circuits shown in FIGS. 4A and 4B, a capacitor 55 is connected between the node between the input of the amplifier 50 and the resistor 56, and ground. A CR filter is formed by the capacitor 55 and the resistor 56, and operates as the delay circuit.

The second embodiment allows the voltage signal a and the threshold b' to definitely cross each other at points P1 and P2 even for a rise time longer than the delay time of the delay circuit. Thus the pulse width distortion can be prevented even for diverse data patterns including irregular pulse width and pulse interval, isolated bits, and low repetition frequency. Hence this embodiment is useful for an optical receiving circuit of an optical coupler used in electronic equipment and industrial equipment.

The embodiments of the invention have been described with reference to the drawings. However, the invention is not limited to these embodiments. For example, the transimpedance amplifier, photodiode, resistor, differential amplifier, comparator, comparison circuit, transconductance amplifier, and delay circuit constituting the optical receiving circuit can be suitably modified by those skilled in the art, and such modifications are also encompassed within the scope of the invention as long as they do not depart from the spirit of the invention.

The invention claimed is:

1. An optical receiving circuit comprising:
   a first transimpedance amplifier configured to convert an input signal to a voltage signal, the input signal being current-converted by a first photodiode;
   a second transimpedance amplifier connected to a light-shielded second photodiode, and being configured to output a reference voltage;

a differential amplifier having a first terminal and a second terminal, and being configured to amplify a difference between the voltage signal inputted to the first terminal and a signal inputted to the second terminal;

a transconductance amplifier configured to receive as input a branch of the voltage signal and output a current signal to the second terminal;

a voltage source configured to superimpose an offset voltage on the output voltage of the second transimpedance amplifier; and a conversion element provided between the voltage source and the second terminal, and being configured to voltage-convert the current signal, wherein, when the voltage signal begins to rise, the transconductance amplifier begins to start up and the signal inputted to the second terminal varies to follow the voltage signal.

2. The optical receiving circuit according to claim 1, wherein an amplitude of the voltage signal is larger than an amplitude of the signal inputted to the second terminal.

3. The optical receiving circuit according to claim 2, wherein the amplitude of the signal inputted to the second terminal is equal to a difference between the amplitude of the voltage signal and twice the offset voltage.

4. The optical receiving circuit according to claim 1, wherein, when the voltage signal begins to fall, the transconductance amplifier begins to go down and the signal inputted to the second terminal varies to follow the voltage signal.

5. The optical receiving circuit according to claim 4, wherein an amplitude of the voltage signal is larger than an amplitude of the signal inputted to the second terminal.

6. The optical receiving circuit according to claim 5, wherein the amplitude of the signal inputted to the second terminal is equal to a difference between the amplitude of the voltage signal and twice the offset voltage.

7. The optical receiving circuit according to claim 1, further comprising a delay circuit provided between the first transimpedance amplifier and the transconductance amplifier.

8. The optical receiving circuit according to claim 1, wherein, when the voltage signal becomes higher than the offset voltage, a balanced signal outputted from the differential amplifier is inverted, and when the voltage signal becomes lower than the signal inputted to the second terminal, the balanced signal outputted from the differential amplifier is inverted.

9. An optical receiving circuit comprising:
a first transimpedance amplifier configured to convert an input signal to a voltage signal, the input signal being current-converted by a first photodiode;
a second transimpedance amplifier connected to a light-shielded second photodiode, and being configured to output a reference voltage;
a differential amplifier having a first terminal and a second terminal, and being configured to amplify a difference between the voltage signal inputted to the first terminal and a signal inputted to the second terminal;
a voltage source configured to superimpose an offset voltage on the output voltage of the second transimpedance amplifier;
a comparison circuit having a first terminal receiving as input a branch of the voltage signal and a second terminal receiving as input a branch of the reference voltage;
a transconductance amplifier receiving as input an output signal of the comparison circuit and having an output terminal connected to the second terminal of the differential amplifier; and
a conversion element provided between the voltage source and the second terminal of the differential amplifier, and being configured to voltage-convert a current signal.

10. The optical receiving circuit according to claim 9, wherein, when the voltage signal becomes higher than a prescribed value, the transconductance amplifier begins to start up in response to receiving as input the output of the comparison circuit and varies the signal inputted to the second terminal to follow the voltage signal.

11. The optical receiving circuit according to claim 10, wherein, when the voltage signal becomes lower than the signal inputted to the second terminal, the transconductance amplifier begins to go down and the signal inputted to the second terminal varies to follow the voltage signal.

12. The optical receiving circuit according to claim 9, wherein an amplitude of the voltage signal inputted to the first terminal is larger than an amplitude of the signal inputted to the second terminal.

13. The optical receiving circuit according to claim 12, wherein the amplitude of the signal inputted to the second terminal is equal to a difference between the amplitude of the voltage signal and twice the offset voltage.

14. The optical receiving circuit according to claim 10, wherein the comparison circuit includes a resistor and a current source ,one terminal of the resistor is the first terminal of the comparison circuit, and the current source is provided between another terminal of the resistor and a ground.

15. The optical receiving circuit according to claim 14, wherein the prescribed value is a product of a resistance of the resistor and a current supplied from the current source.

16. The optical receiving circuit according to claim 14, wherein a capacitor is connected between the another terminal of the resistor and a ground.

17. The optical receiving circuit according to claim 11, wherein, when the voltage signal becomes higher than the offset voltage, a balanced signal outputted from the differential amplifier is inverted, and when the voltage signal becomes lower than the signal inputted to the second terminal, the balanced signal outputted from the differential amplifier is inverted.

18. An optical receiving circuit comprising:
a first transimpedance amplifier configured to convert an input signal to a voltage signal, the input signal being current-converted by a first photodiode;
a second transimpedance amplifier connected to a light-shielded second photodiode, and being configured to output a reference voltage;
a differential amplifier having a first terminal and a second terminal for amplifying a difference between the voltage signal inputted to the first terminal and a signal inputted to the second terminal;
a voltage source configured to superimpose an offset voltage on the output voltage of the second transimpedance amplifier;
a comparison circuit having a first terminal receiving as input a branch of the voltage signal through a delay circuit and a second terminal receiving as input a branch of the reference voltage;
a transconductance amplifier receiving as input an output signal of the comparison circuit and having an output terminal connected to the second terminal of the differential amplifier; and
a conversion element provided between the voltage source and the second terminal of the differential amplifier, and being configured to voltage-convert a current signal.

19. The optical receiving circuit according to claim 18, wherein the delay circuit includes; a capacitor connected between the first transimpedance amplifier and the first terminal; and a capacitor connected between a node between the resistor and the first terminal and a ground.

* * * * *